(12) United States Patent
Camuffo

(10) Patent No.: US 12,237,855 B2
(45) Date of Patent: Feb. 25, 2025

(54) ERROR VALUE MAGNITUDE DETECTOR FOR WIRELESS TRANSMITTER

(71) Applicant: Apple Inc., Cupertino, CA (US)

(72) Inventor: Andrea Camuffo, Munich (DE)

(73) Assignee: Apple Inc., Cupertino, CA (US)

( * ) Notice: Subject to any disclaimer, the term of this patent is extended or adjusted under 35 U.S.C. 154(b) by 333 days.

(21) Appl. No.: 17/729,229

(22) Filed: Apr. 26, 2022

(65) Prior Publication Data

US 2023/0085876 A1    Mar. 23, 2023

Related U.S. Application Data

(60) Provisional application No. 63/247,025, filed on Sep. 22, 2021.

(51) Int. Cl.
    *H04B 1/04*    (2006.01)

(52) U.S. Cl.
    CPC ......... *H04B 1/0458* (2013.01); *H04B 1/0475* (2013.01); *H04B 2001/0408* (2013.01)

(58) Field of Classification Search
    CPC ............... H04B 1/0458; H04B 1/0475; H04B 2001/0408; H04B 2001/0416; H04B 1/04; H03F 2200/105; H03F 2200/451; H03F 1/0261; H03F 1/32; H03F 3/189; H03F 3/24; H03G 3/3042
    See application file for complete search history.

(56) References Cited

U.S. PATENT DOCUMENTS

| | | |
|---|---|---|
| 6,166,598 A | 12/2000 | Schlueter |
| 6,894,562 B2 | 5/2005 | Nakayama |
| 8,639,199 B1 | 1/2014 | Premakanthan et al. |
| 8,648,588 B2 | 2/2014 | Eken |
| 10,382,132 B2 | 8/2019 | Gupta |
| 10,454,510 B2 | 10/2019 | Lange |
| 11,088,755 B2 | 8/2021 | Ashrafi |

(Continued)

FOREIGN PATENT DOCUMENTS

| | | |
|---|---|---|
| CN | 103873402 A | 6/2014 |
| CN | 105930086 A | 9/2016 |
| CN | 106253861 A | 12/2016 |

OTHER PUBLICATIONS

Extended European Search Report for European Patent Application No. 22188373 dated Feb. 8, 2023; 11 pgs.

(Continued)

*Primary Examiner* — Said M Elnoubi
(74) *Attorney, Agent, or Firm* — Fletcher Yoder, P.C.

(57) ABSTRACT

An amplifier of a transmitter includes an input that receives an input signal and generates an amplified signal at an output. A digital power meter is coupled to the input of the amplifier, generates an estimated amplified signal, and determines peak and average powers of the estimated amplified signal. An output power detector coupled to the output of the amplifier determines peak and average powers of the amplified signal. A controller coupled to the digital power meter and the output power detector determines an estimated crest factor based on the peak and average powers of the estimated amplified signal, an amplified crest factor based on the peak and average powers of the amplified signal, and an error vector magnitude based on the estimated and amplified crest factors. The controller, which is also coupled to the amplifier, then adjusts operation of the amplifier based on the error vector magnitude.

20 Claims, 10 Drawing Sheets

(56) References Cited

U.S. PATENT DOCUMENTS

| | | |
|---|---|---|
| 2010/0087227 A1 | 4/2010 | Francos |
| 2016/0365880 A1 | 12/2016 | Magesacher et al. |
| 2016/0373072 A1 | 12/2016 | Magesacher et al. |

OTHER PUBLICATIONS

Office Action for Chinese Patent Application No. 202210577449.9 dated Sep. 27, 2024; 8 pgs.

ERROR VALUE MAGNITUDE DETECTOR FOR WIRELESS TRANSMITTER

CROSS-REFERENCE TO RELATED APPLICATION

This application claims the benefit of U.S. Provisional Application No. 63/247,025, filed Sep. 22, 2021, entitled "ERROR VALUE MAGNITUDE DETECTOR FOR WIRELESS TRANSMITTER," the disclosure of which is incorporated by reference in its entirety for all purposes.

BACKGROUND

The present disclosure relates generally to wireless communication, and more specifically to efficiently transmitting wireless signals.

In an electronic device (e.g., a wireless communication device), a transmitter may include one or more amplifiers (e.g., a power amplifier) that increase a power of a transmission signal sent on a frequency channel to ensure that a destination or receive device receives the transmission signal with sufficient signal quality and power. To prevent the transmission signal from interfering with other signals on other frequency channels, the electronic device may decrease the power gained from the one or more amplifiers by causing the one or more amplifiers to apply a power backoff. However, in some cases, the power backoff may be excessive, and, as a result, the transmission signal may be sent with decreased power.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a transmitter includes an amplifier, a digital power meter coupled to an input of the amplifier, and an output power detector coupled to an output of the amplifier. The output power detector includes an attenuator, a wideband detector coupled to the attenuator, and a peak-hold detector coupled in parallel with a low-pass filter to the wideband detector. The transmitter also includes control circuitry coupled to the digital power meter, the output power detector, and the amplifier.

In another embodiment, a method includes determining an estimated crest factor based on an input signal received at an amplifier of a transmitter, determining an amplified crest factor based on an output signal output by the amplifier, determining a ratio between the estimated crest factor and the amplified crest factor, and adjusting operation of the amplifier based on the ratio.

In yet another embodiment, an electronic device includes one or more antennas and a transmitter. The transmitter includes an amplifier that receives an input signal and amplifies the input signal by an amplification factor to output an output signal. The transmitter also includes a digital power meter that determines an estimated crest factor based on the input signal, an output power detector that determines an amplified crest factor based on the output signal, and control circuitry that adjusts the amplification factor based on the estimated crest factor and the amplified crest factor.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
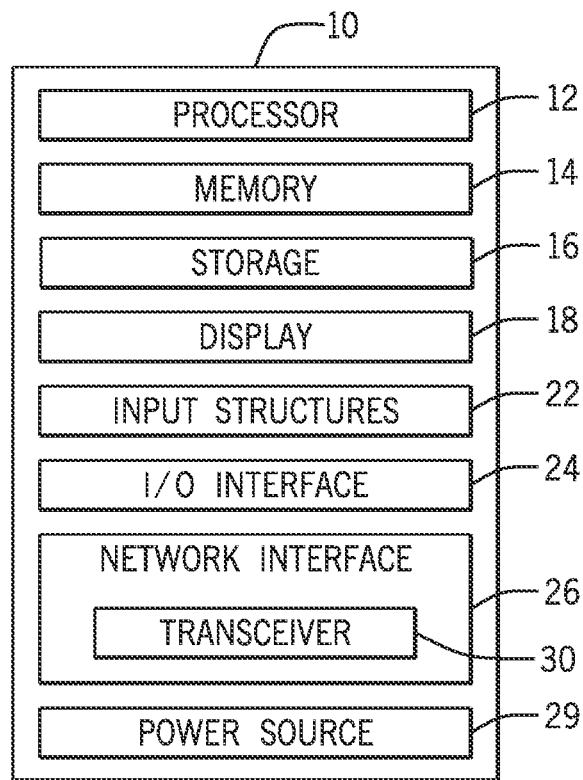
FIG. 1 is a block diagram of an electronic device, according to embodiments of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on.

In an electronic device (e.g., a wireless communication device), a transmitter may include one or more amplifiers (e.g., a power amplifier) that increase a power of a transmission signal sent on a frequency channel to ensure that a recipient receives the transmission signal with sufficient signal quality and power. The one or more amplifiers may include at least a linear amplifier, which may produce an output signal that is an accurate copy of the input signal at increased power levels for a linear region. That is, for a certain range of input power of the input signal, the amplifier may produce an output signal that is an accurate copy of the input signal having an output power that is greater than the input signal. However, outside of this linear region (e.g., in a nonlinear region), the amplifier may produce an output signal that is not an accurate copy of the input signal. When operating outside of this linear region, the output signal that is not an accurate copy of the input signal may cause emissions (e.g., spurious emissions) that are outside of the frequency channel, and an error vector magnitude of the amplifier increases. These emissions may interfere with other signals that are outside of the frequency channel. To prevent the transmission signal from interfering with these other signals on other frequency channels and to keep the error vector magnitude sufficiently low to maintain high throughput of the amplifier, the electronic device may decrease the power gained from the amplifier by causing the one or more amplifiers to apply a power backoff. However, in some cases, the power backoff may be excessive, and, as a result, the transmission signal may be sent with decreased power.

Embodiments herein provide various apparatuses and techniques to efficiently transmit wireless signals at an increased transmission power with decreased interference to signals outside of a desired frequency channel. To do so, the embodiments disclosed herein include an amplifier of a transmitter of a wireless communication device that has an input that receives an input signal and generates an amplified signal at an output. A digital power meter is coupled to the input of the amplifier and generates an estimated amplified signal that the amplifier may ideally output, and determines a peak power and an average power of the estimated amplified signal. An output power detector coupled to the output of the amplifier determines a peak power and an average power of the amplified signal. A controller coupled to the digital power meter and the output power detector determines an estimated crest factor based on the peak power and the average power of the estimated amplified signal, an amplified crest factor based on the peak power and the average power of the amplified signal, and an error vector magnitude based on the estimated crest factor and the amplified crest factor. The controller, which is also coupled to the amplifier, then adjusts operation of the amplifier based on the error vector magnitude. Because the error vector magnitude is indicative of the amount of amplification headroom that may yet be gained before the amplifier reaches the nonlinear region, the controller may accurately increase an amplification factor of the amplifier within the amplification headroom using the error vector magnitude, without resulting in excessive emissions in other frequency channels. As such, transmission power may be increased without negatively impacting other communications.

FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive data between one another. It should be noted that FIG. 1 is merely one example of a particular implementation and is intended to illustrate the types of components that may be present in electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices. It should be noted that the processor 12 and other related items in FIG. 1 may be generally referred to herein as "data processing circuitry." Such data processing circuitry may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector provided by Apple Inc. of Cupertino, Calif., a universal serial bus (USB), or other similar connector and protocol. The network interface 26 may include, for example, one or more interfaces for a personal area network (PAN), such as an ultra-wideband (UWB) or a BLUETOOTH® network, for a local area network (LAN) or wireless local area network (WLAN), such as a network employing one of the IEEE 802.11x family of protocols (e.g., WI-FI®), and/or for a wide area network (WAN), such as any standards related to the Third Generation Partnership Project (3GPP), including, for example, a $3^{rd}$ generation (3G) cellular network, universal mobile telecommunication system (UMTS), $4^{th}$ generation (4G) cellular network, long term evolution (LTE®) cellular network, long term evolution license assisted access (LTE-LAA) cellular network, $5^{th}$ generation (5G) cellular network, New Radio (NR) cellular network, $6^{th}$ generation (6G) cellular network and beyond, a satellite network, and so on. In particular, the network interface 26 may include, for example, one or more interfaces for using a Release-15 cellular communication standard of the 5G specifications that include the millimeter wave (mmWave) frequency range (e.g., 24.25-300 gigahertz (GHz)) and/or any other cellular communication standard release (e.g., Release-16, Release-17, any future releases) that define and/or enable frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. The power source 29 of the electronic device 10 may include any suitable source of power, such as a rechargeable lithium polymer (Li-poly) battery and/or an alternating current (AC) power converter.

Figure 2:
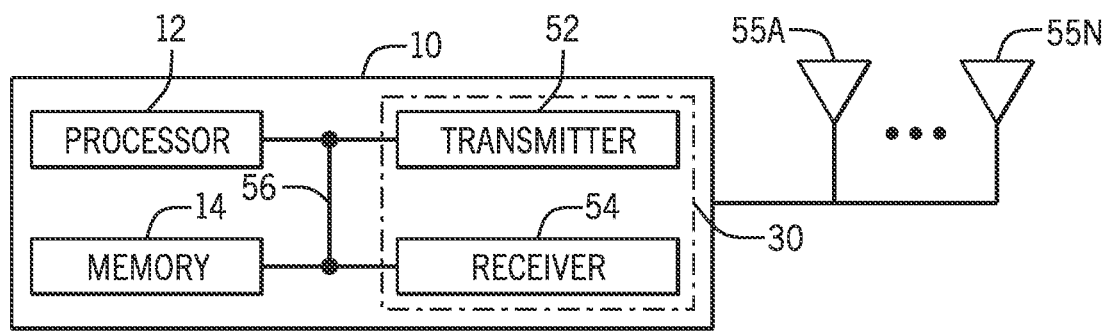
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 30, a transmitter 52, a receiver 54, and/or antennas 55 (illustrated as 55A-55N, collectively referred to as an antenna 55) may be communicatively coupled directly or indirectly (e.g., through or via another component, a communication bus, a network) to one another to transmit and/or receive data between one another.

The electronic device 10 may include the transmitter 52 and/or the receiver 54 that respectively enable transmission and reception of data between the electronic device 10 and an external device via, for example, a network (e.g., including base stations) or a direct connection. As illustrated, the transmitter 52 and the receiver 54 may be combined into the transceiver 30. The electronic device 10 may also have one or more antennas 55A-55N electrically coupled to the transceiver 30. The antennas 55A-55N may be configured in an omnidirectional or directional configuration, in a single-beam, dual-beam, or multi-beam arrangement, and so on. Each antenna 55 may be associated with a one or more beams and various configurations. In some embodiments, multiple antennas of the antennas 55A-55N of an antenna group or module may be communicatively coupled a respective transceiver 30 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 54 may transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

Figure 3:
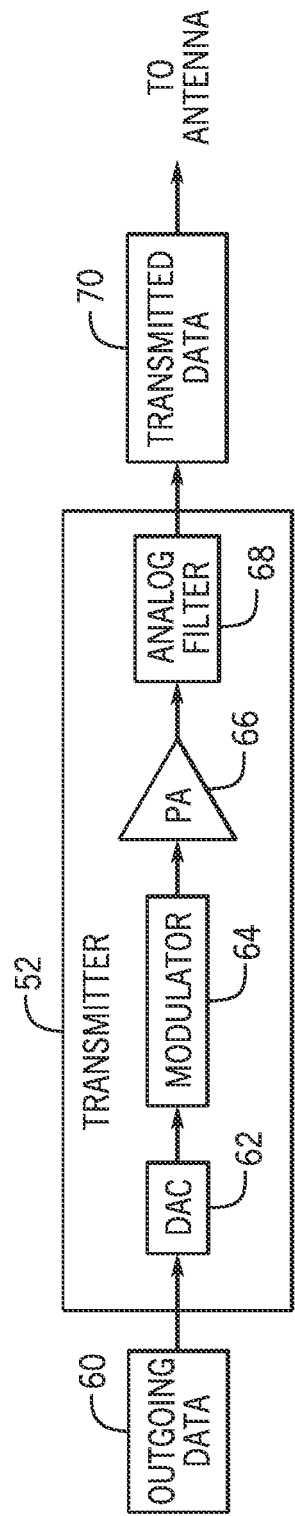
FIG. 3 is a schematic diagram of a transmitter of the electronic device of FIG. 1, according to embodiments of the present disclosure.

FIG. 3 is a schematic diagram of the transmitter 52 (e.g., transmit circuitry), according to embodiments of the present disclosure. As illustrated, the transmitter 52 may receive outgoing data 60 in the form of a digital signal to be transmitted via the one or more antennas 55. A digital-to-analog converter (DAC) 62 of the transmitter 52 may convert the digital signal to an analog signal, and a modulator 64 may combine the converted analog signal with a carrier signal to generate a radio wave. A power amplifier (PA) 66 receives the modulated signal from the modulator 64. The power amplifier 66 may amplify the modulated signal to a suitable level to drive transmission of the signal via the one or more antennas 55. A filter 68 (e.g., filter circuitry and/or software) of the transmitter 52 may then remove undesirable noise from the amplified signal to generate transmitted data 70 to be transmitted via the one or more antennas 55. The filter 68 may include any suitable filter or filters to remove the undesirable noise from the amplified signal, such as a bandpass filter, a bandstop filter, a low pass filter, a high pass filter, and/or a decimation filter. Additionally, the transmitter 52 may include any suitable additional components not shown, or may not include certain of the illustrated components, such that the transmitter 52 may transmit the outgoing data 60 via the one or more antennas 55. For example, the transmitter 52 may include a mixer and/or a digital up converter. As another example, the transmitter 52 may not include the filter 68 if the power amplifier 66 outputs the amplified signal in or approximately in a desired frequency range (such that filtering of the amplified signal may be unnecessary).

Figure 4:
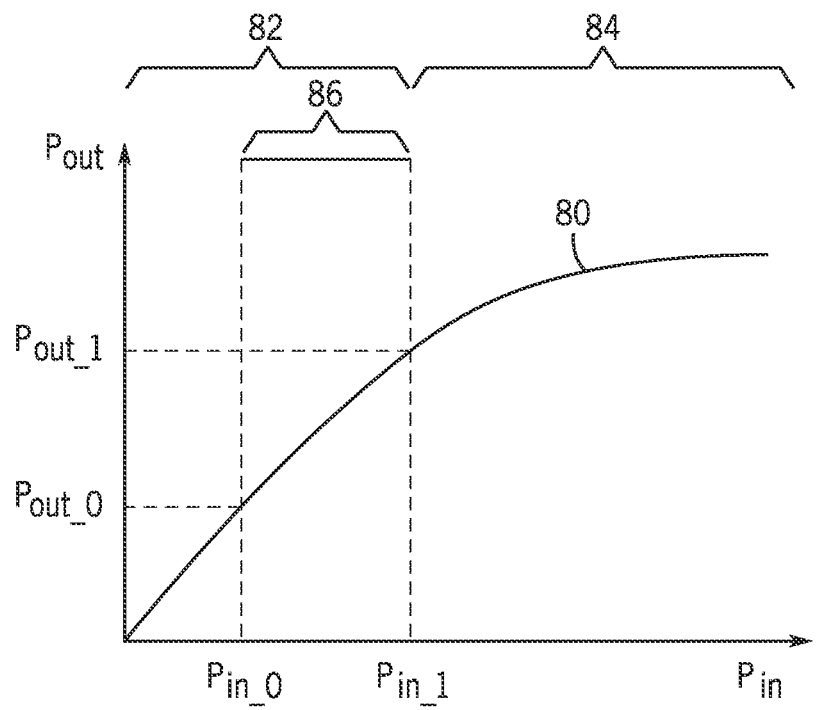
FIG. 4 is a plot illustrating a power curve or amplification factor describing operation of a power amplifier of the transmitter of FIG. 3, according to embodiments of the present disclosure.

As discussed above, the power amplifier 66, or any other amplifier that may be included in the transmitter 52, may increase a power of a transmission signal sent on a frequency channel to ensure that a recipient receives the transmission signal with sufficient signal quality and power. In some embodiments, the power amplifier 66 may include a linear amplifier, which may produce an output signal that is an accurate copy of the input signal at increased power levels for a linear region. FIG. 4 is a plot illustrating a power curve or amplification factor 80 (e.g., $P_{out}/P_{in}$) describing operation of the power amplifier 66, according to embodiments of the present disclosure. The horizontal or x-axis of the plot represents input power ($P_{in}$) of an input signal of the power amplifier 66, and the vertical or y-axis of the plot represents output power ($P_{out}$) of an output signal of the power amplifier 66, where the power of the output signal has been amplified by the power amplifier 66. As illustrated, for a certain range of input power of the input signal, referred to as the linear region 82, the relationship between $P_{in}$ and $P_{out}$ is approximately linear (such that the output signal is an accurate copy of the input signal having an output power that is greater than the input signal). However, outside of the linear region 82, in a nonlinear region 84 where the relationship between $P_{in}$ and $P_{out}$ is no longer approximately linear, the power amplifier 66 may no longer produce an output signal that is an accurate copy of the input signal. Indeed, the amplification factor 80 of the power amplifier 66 may decrease. Moreover, when operating in the nonlinear region 84, the output signal may cause emissions (e.g., spurious emissions) outside of the frequency channel that the transmitter 52 sends the transmission signal. These emissions may interfere with other signals that are outside of the frequency channel.

To meet error vector magnitude targets (e.g., measures used to quantify performance of the transmitter 52), which may prevent the transmission signal from interfering with these other signals on other frequency channels, the processor 12 may decrease the power gained from the power amplifier 66 by causing the power amplifier 66 to apply a power backoff. For example, the processor 12 may decrease the input power of the input signal to the power amplifier 66, adjust bias voltages or currents of the power amplifier 66 to decrease the amplification factor 80, and so on. However, in some cases, the power backoff may be excessive, and, as a result, the transmission signal may be sent with decreased power. For example, as illustrated in FIG. 4, the processor 12 may cause the power amplifier 66 to apply a power backoff such that an input signal having an input power $P_{in\_0}$ is received by the power amplifier 66, which amplifies the input signal and generates an output signal having an output power $P_{out\_0}$. But more transmission power may be realized if the applied power backoff were less, such that an input signal having an input power $P_{in\_1}$ received by the power amplifier 66 would be amplified by the power amplifier 66 to generate an output signal having an output power $P_{out\_1}$. This difference in amplification factor 80 (or input power $P_{in\_1} - P_{in\_0}$) may be referred to as headroom 86 (e.g., a buffer between a first input power, such as $P_{in\_0}$, and a second input power, such as $P_{in\_1}$, that causes the power amplifier 66 to enter the nonlinear region 84). In some cases, the headroom 86 is provided to account for factors that may affect (e.g., increase) the amplification factor 80, such that it would cause the power amplifier 66 to undesirably operate in the nonlinear region 84, such as changes in temperature, voltage standing wave ratio, manufacturing, process variation, real-world imperfections, different beam configurations, and so on.

Figure 5:
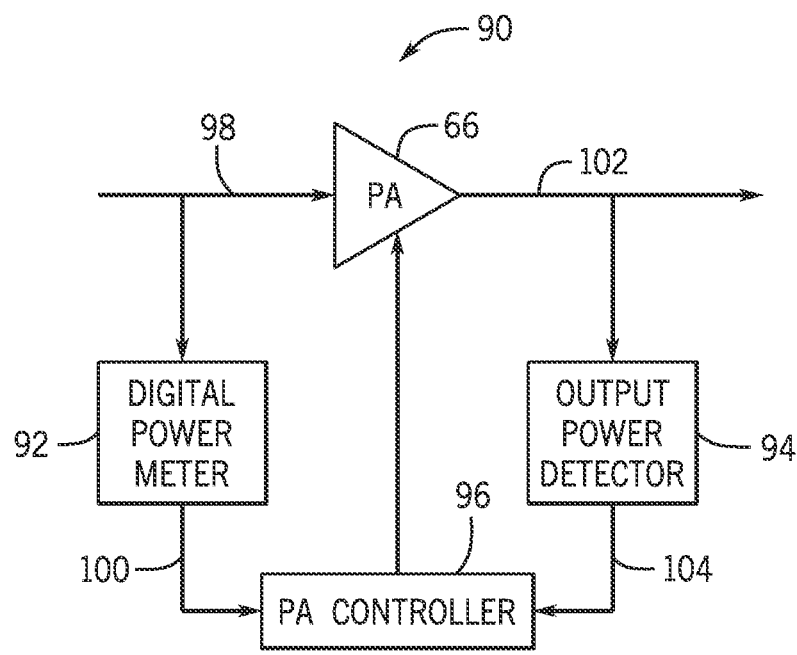
FIG. 5 is a schematic diagram of a portion of the transmitter of FIG. 3 having a digital power meter, an output power detector, and a power amplifier controller, according to embodiments of the present disclosure.

To determine whether the amplification factor 80 may be increased, and by how much, a portion 90 of the transmitter 52 may include a digital power meter 92, an output power detector 94, and a power amplifier controller 96, as illustrated in FIG. 5, according to embodiments of the present disclosure. The digital power meter 92 may be coupled to an input 98 of the power amplifier 66, may generate (e.g., estimate and/or simulate) an estimated amplified signal that the power amplifier 66 may ideally output, and may determine a peak power and an average power of the estimated amplified signal, as described in further detail below. The digital power meter 92 may send a signal 100 indicating the peak power and the average power of the estimated amplified signal to the power controller 96. The output power detector 94 may be coupled to an output 102 of the power amplifier 66 and determine a peak power and an average power of the amplified signal, and send a signal 104 indicating the peak power and the average power of the amplified signal to the power controller 96. The power amplifier controller 96 may be coupled to the digital power meter 92 and the output power detector 94, determine an estimated crest factor based on the peak power and the average power of the estimated amplified signal (e.g., a ratio between the peak power and the average power of the estimated amplified signal), determine an amplified crest factor based on the peak power and the average power of the amplified signal (e.g., a ratio between the peak power and the average power of the amplified signal), and determine an error vector magnitude based on the estimated crest factor and the amplified crest factor (e.g., a ratio between the estimated crest factor and the amplified crest factor). The power amplifier controller 96, which is also coupled to the power amplifier 66, may then adjust operation of the power amplifier 66 based on the error vector magnitude. Because the error vector magnitude may be indicative of the amount of amplification headroom (e.g., 86) that may yet be gained before the power amplifier 66 reaches or operates in the nonlinear region 84, the power amplifier controller 96 may accurately increase an amplification factor of the power amplifier 66 within the amplification headroom 86 using the error vector magnitude, without resulting in excessive emissions in other frequency channels. In this manner, transmission power may be increased without negatively impacting other communications. It should be understood that the power amplifier controller 96 may include any suitable processing circuitry, and, as such, be part of or external to the processor 12.

Figure 6:
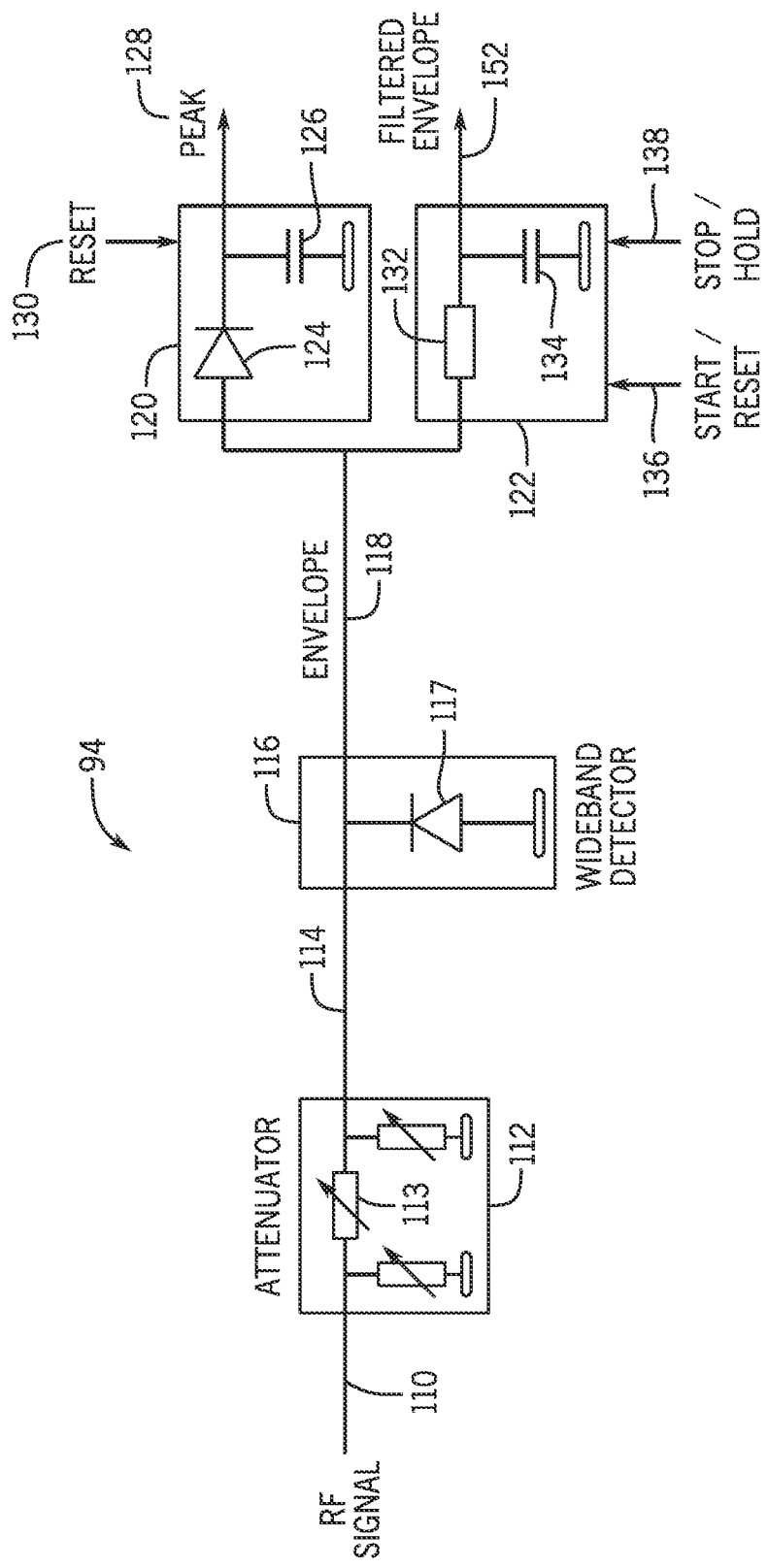
FIG. 6 is a schematic diagram of an output power detector of the transmitter of FIG. 3, according to embodiments of the present disclosure.

FIG. 6 is a schematic diagram of the output power detector 94, according to embodiments of the present disclosure. The output power detector 94 may be coupled to the output 102 of the power amplifier 66 (e.g., via a coupler), and receive an amplified output signal 110 (e.g., a radio frequency (RF) signal) from the output 102. The output power detector 94 may have a relatively large bandwidth (e.g., 50 (MHz) megahertz or greater, 80 MHz or greater, 100 MHz or greater, and so on), such as 80 MHz. The output power detector 94 may include a programmable attenuator 112 having one or more variable resistors 113 coupled in any suitable configuration, such as that which is illustrated in FIG. 6. The programmable attenuator 112 may attenuate the signal 110 by reducing a power of the signal 110 without appreciably distorting its waveform to generate an attenuated signal 114. The output power detector 94 may also include a wideband detector or rectifier 116 that converts the attenuated signal (which may have a frequency within a radio frequency range (e.g., 1 hertz (Hz) to 3000 gigahertz (GHz)) to a baseband signal (having a baseband frequency (e.g., 1 Hz to 20 kilohertz (kHz)), and outputs an envelope 118 (e.g., representative of the boundary or extremes) of the baseband signal. As such, the wideband detector 116 may function as an envelope detector. As illustrated, the wideband detector 116 may include at least a diode 117.

Figure 7:
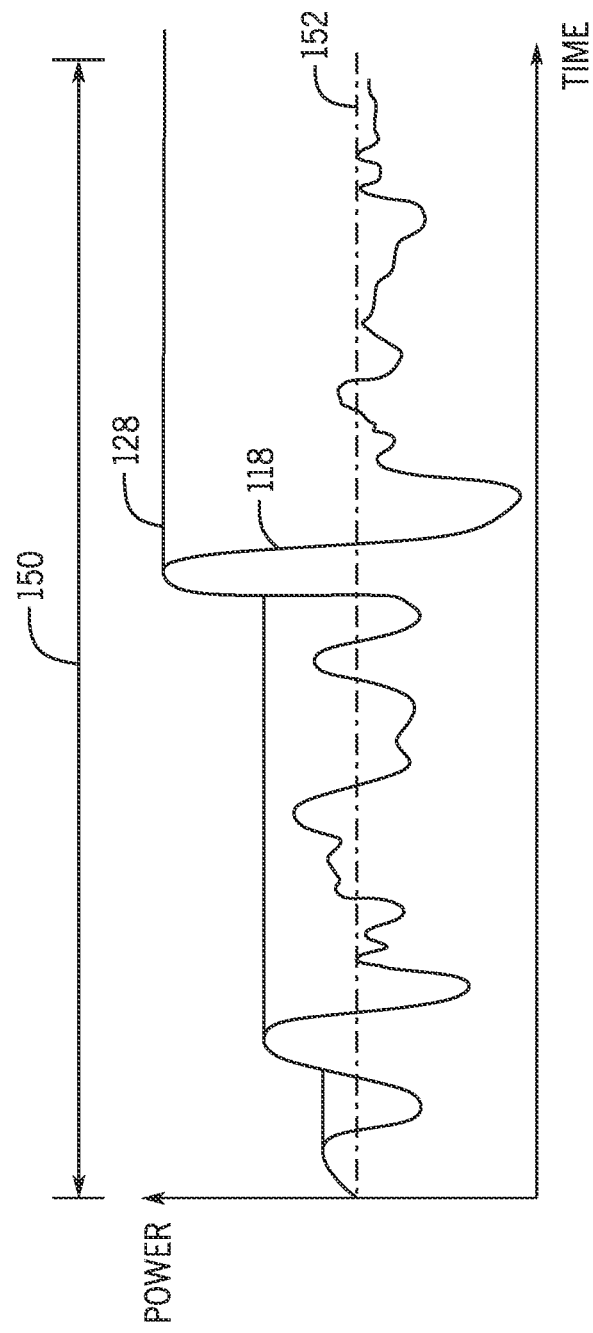
FIG. 7 is an example of operation of a peak-hold detector of the output power detector of FIG. 6, according to embodiments of the present disclosure.

The output power detector 94 may include a peak-hold detector 120 and a low-pass filter 122 that are coupled in parallel to the wideband detector 116. The peak-hold detector 120 may include at least a diode 124 and a capacitor 126, and determine a peak power 128 (e.g., maximum power value) of the baseband or envelope signal 118 (e.g., within an observation window). FIG. 7 is an example of operation of the peak-hold detector 120, according to embodiments of the present disclosure. For the baseband or envelope signal 118 (where the horizontal or x-axis of the illustrated plot represents time, and the vertical or y-axis of the plot represents power of the baseband or envelope signal 118), the peak-hold detector 120 may store or "hold" a peak or maximum power 128 of the baseband or envelope signal 118 for the observation window 150. As time progresses, if the signal increases in power, the peak-hold detector 120 may store or hold the increased power value. At the end of the observation window 150, the peak-hold detector 120 may be storing the peak or maximum power 128 of the baseband or envelope signal 118.

Referring back to FIG. 6, the peak-hold detector 120 may include reset functionality 130 (e.g., to reset the peak-hold detector 120 to determine a next peak power 128 of a signal) and detect and hold a peak power 128 for a retain time corresponding to the observation window 150 (e.g., of 5 microseconds (µs)). The observation window 150 may be based on a symbol duration and/or a subcarrier spacing. For example, for a larger subcarrier spacing of 120 kHz, the symbol duration may be approximately 8 µs. As such, a decreased observation window 150 that may be used is approximately 5 µs.

The low-pass filter 122 may filter a relatively narrow bandwidth (e.g., less than that of the output power detector 94), such as 1 MHz. The low-pass filter 122 may include at least a resistor 132 and a capacitor 134, have one pole, and have start/reset functionality 136 and stop/hold functionality 138. At the beginning of an observation window 150, the peak-hold detector 120 and the low-pass filter 122 may be reset using respective reset functionalities 130, 136. Referring back to FIG. 7, the low-pass filter 122 may determine an average power 152 of the baseband or envelope signal 118.

The power amplifier controller 96 may receive the peak power 128 and the average power 152 from the output power detector 94 (e.g., via the signal 104). The power amplifier controller 96 may then determine an amplified crest factor (e.g., a ratio of the peak power 128 to the average power 152) of the amplified signal output by the power amplifier 66. In some embodiments, the electronic device 10 may include multiple transmitters 52, each having amplifiers (e.g., 66), thus each having a respective output power detector 94. In some cases, a first output power detector 94 of a first transmitter 52 may receive leakage of a transmission signal transmitter by a second transmitter 52. It should be understood that, because this leakage may be part of a transmission signal transmitted by the first transmitter 52, the leakage may not be compensated for.

Figure 8:
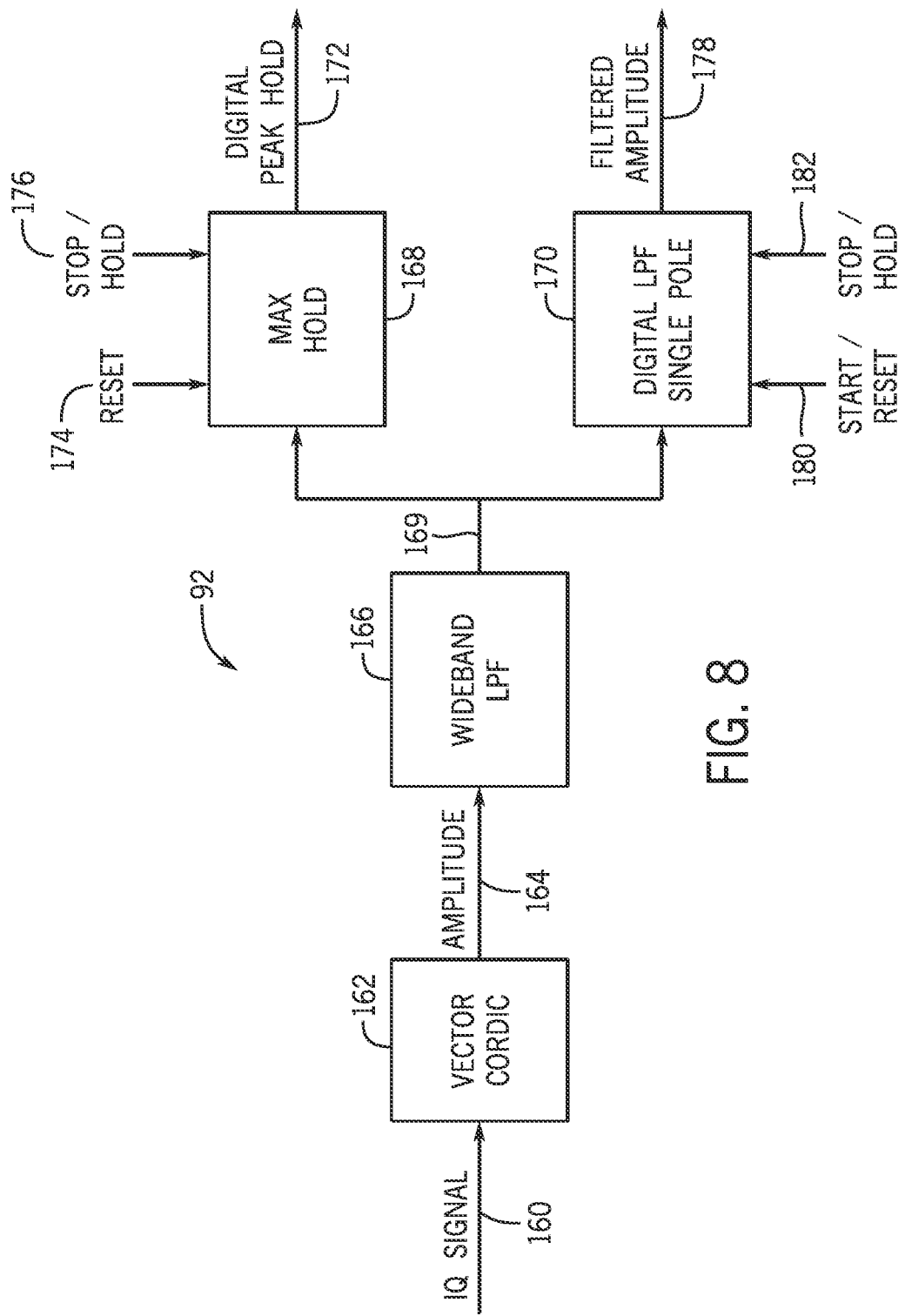
FIG. 8 is a schematic diagram of digital power meter of the transmitter of FIG. 3, according to embodiments of the present disclosure.

Because the error vector magnitude of the power amplifier 66 is not only dependent on the power and crest factor of the amplified signal, but also modulation content of the input signal to the power amplifier 66, the digital power meter 92 may facilitate providing a reference crest factor. FIG. 8 is a schematic diagram of the digital power meter 92, according to embodiments of the present disclosure. The digital power meter 92 may be coupled to the input 98 of the power amplifier 66, and receive an input signal 160 (e.g., a quadrature or "IQ" signal having in-phase and quadrature components) from the input 98. The digital power meter 92 may low-pass filter an amplitude of an estimated or simulated transmission signal (e.g., an estimated or simulated amplified signal that the power amplifier 66 may ideally output or output without consideration of real-world factors, such as environmental factors (including temperature, humidity, and so on), process variation, manufacturing defects, channel frequency, beam-forming parameters, and so on), thus facilitating generation of a reference crest factor for comparison to the amplified crest factor.

The digital power meter 92 may include digital components, such as a vector CORDIC (COordinate Rotation DIgital Computer) 162 that executes a vectoring algorithm to rotate one or more vectors of the input signal 160 to determine (e.g., measure, estimate, and/or simulate) an amplitude 164 (e.g., in the form of an estimated amplified signal) of an ideally amplified (e.g., by the power amplifier 66) input signal 160 or amplified without consideration of real-world factors. The digital power meter 92 may also include a wideband low-pass filter 166 that may include an infinite impulse response filter that may mimic or simulate a characteristic of a radio frequency envelope detector (e.g., the wideband detector 116 of the output power detector 94). The wideband low-pass filter 166 may have a relatively large bandwidth (e.g., 50 (MHz) megahertz or greater, 80 MHz or greater, 100 MHz or greater, and so on), such as 80 MHz.

The digital power meter 92 may include a max-hold register 168 and a digital low-pass filter 170 coupled in parallel to the wideband low-pass filter 166. The max-hold register 168 may capture a maximum or highest modulation peak (e.g., a peak power 172) of the low-pass filtered amplitude 169 of the estimated amplified signal in an observation window (e.g., that may match the observation window 150 of the peak-hold detector 120). In particular, the max-hold register 168 may perform a similar technique as shown in FIG. 7 to determine the peak power 172 of the low-pass filtered amplitude 169 signal. As illustrated, the max-hold register 168 may include reset functionality 174 and stop/hold functionality 176. The digital low-pass filter 170 may also include an infinite impulse response filter that is may mimic or simulate a behavior of an analog low-pass filter (e.g., the low-pass filter 122 of the output power detector 94). As such, the digital low-pass filter 170 may have a dominant pole (e.g., at 1 MHz). The digital low-pass filter 170 may determine a filtered amplitude or average power 178 of the estimated amplified signal in the observation window. As such, the digital power meter 92 may serve to generate an estimated amplified signal (e.g., 164) by the power amplifier 66, and simulate the operations performed by the output power detector 94 on the estimated amplified signal 164. The digital low-pass filter 170 may also include start/reset functionality 180 and stop/hold functionality 182.

Figure 9:
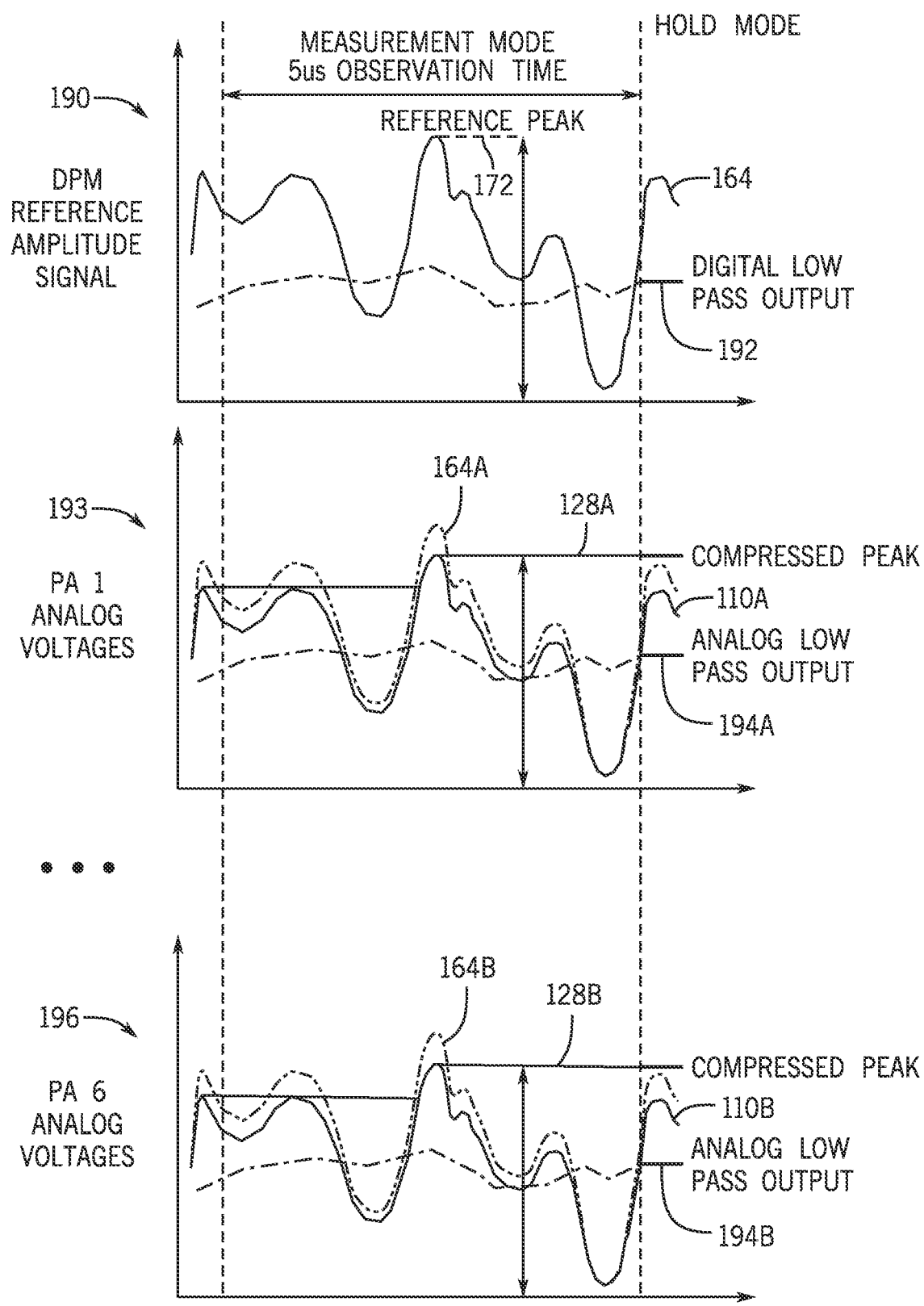
FIG. 9 is series of plots comparing peak power of an estimated amplified signal as determined by the digital power meter of FIG. 8 and peak power of an amplified signal as determined by the output power detector of FIG. 6, according to embodiments of the present disclosure.

The power amplifier controller 96 may receive the peak power 172 and the average power 178 from the digital power meter 92 (e.g., via the signal 100). The power amplifier controller 96 may then determine an estimated crest factor (e.g., a ratio of the peak power 172 to the average power 178) of the estimated amplified signal 164 generated by the digital power meter 92. FIG. 9 is series of plots comparing the peak power 172 of the estimated amplified signal 164 as determined by the digital power meter 92 and the peak power of the amplified signal 110 output by the power amplifier 66 as determined by the output power detector 94, according to embodiments of the present disclosure. A first plot 190 illustrates a digital low pass output 192 and the peak power 172 of the estimated amplified signal 164 (e.g., the reference amplitude signal). A second plot 193 illustrates an analog low pass output 194A and the peak power 128A of the amplified signal 110A output by a first power amplifier 66. A third plot 196 illustrates an analog low pass output 194B and the peak power 128B of the amplified signal 110B output by a second power amplifier 66. Superimposed on both the amplified signals 110A, 110B is the estimated amplified signal 164. As illustrated, the amplified signals 110A, 110B are compressed or have less amplitude than the estimated amplified signal 164. As such, the second and third plots 193, 196 indicate that the first and second power amplifiers 66 may increase their respective amplification factors due to this difference in amplitude, which is reflected in greater error vector magnitude values.

Figure 10:
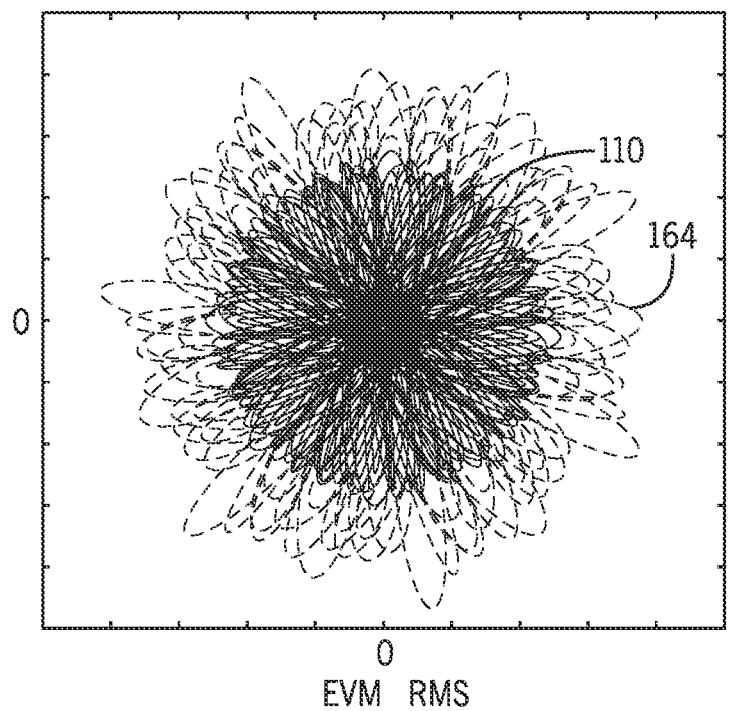
FIG. 10 illustrates a comparison between the estimated amplified signal output and the amplified signal with an error vector magnitude of 4%, as plotted on a complex plane, according to embodiments of the present disclosure.

FIG. 10 illustrates a comparison between the amplified signal 110 output by the power amplifier 66 and the estimated amplified signal 164 with an error vector magnitude of 4% as caused by amplitude-modulation to amplitude-modulation (AMAM) compression, as plotted on a complex plane, according to embodiments of the present disclosure.

Figure 11:
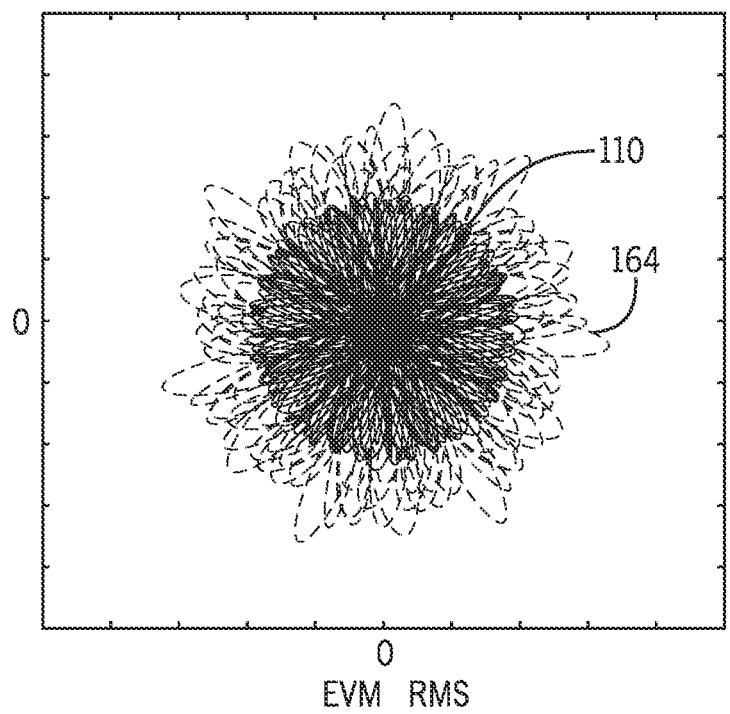
FIG. 11 illustrates a comparison between the estimated amplified signal output and the amplified signal with an error vector magnitude of 6%, as plotted on a complex plane, according to embodiments of the present disclosure.

FIG. 11 illustrates a comparison between the amplified signal 110 output by the power amplifier 66 and the estimated amplified signal 164 with an error vector magnitude of 6% as caused by AMAM compression, as plotted on a complex plane, according to embodiments of the present disclosure. In each of FIGS. 10 and 11, solidly drawn lines that are largely concentrated in a more central portion represent the amplified signal 110, and dashed lines that are less concentrated in the more central portion and diffused outside the more central portion in a more edge-disposed portion represent the estimated amplified signal 164. As shown, peaks of the estimated amplified signal 164 are compressed (compared to that of the amplified signal 110), with the greater error vector magnitude in FIG. 11 resulting in greater compression (compared to that of FIG. 10).

Figure 12:
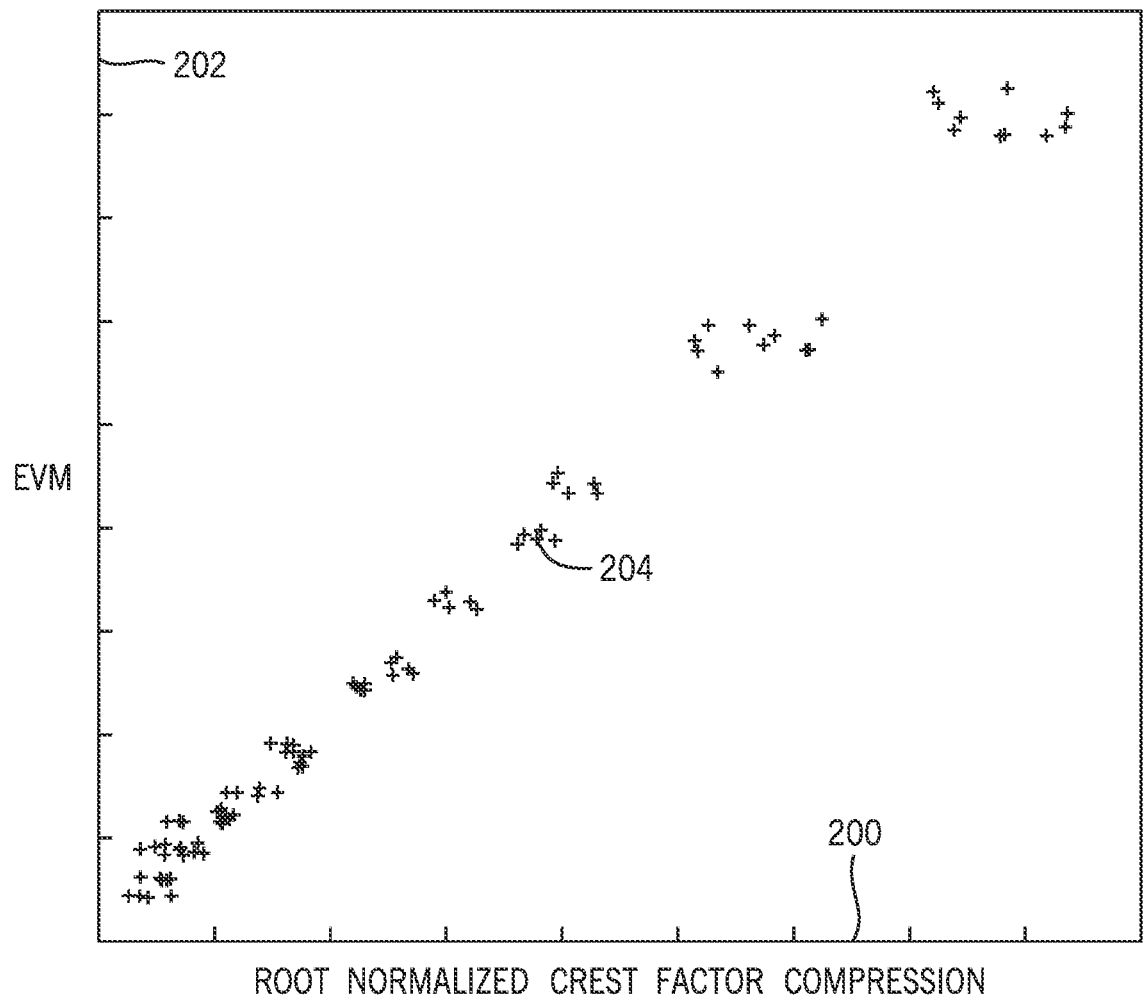
FIG. 12 is a plot illustrating correlation between normalized crest factor compression and compression error vector magnitude for different amplitude-modulation to amplitude-modulation curves, according to embodiments of the present disclosure.

Comparing a ratio between the crest factors of the estimated amplified signal 164 to the amplified signal 110 enables indirectly measuring or estimating the error vector magnitude. Indeed, crest factor compression (CFC), a ratio of the estimated crest factor versus one measured at the output of the power amplifier 66 (e.g., the amplified crest factor) correlates with error vector magnitude (EVM), and therefore may be used as an indirect EVM measurement. A greater correlation may be realized when the CFC is scaled with a square root of the peak 128 of the amplified signal 110 in the observation window 150, as this may reduce a statistical spread due to modulation content of the amplified signal 110 in the observation window 150. FIG. 12 is a plot illustrating correlation between normalized CFC 200 (e.g., normalized based on the square root of the peak 128 of the amplified signal 110 in the observation window 150) and compression EVM 202 (e.g., EVM generated by compression) for different AMAM curves 204, according to embodiments of the present disclosure. As shown, there is a strong correlation (e.g., indicative of a direct relationship) between CFC 200 and EVM 202.

Figure 13:
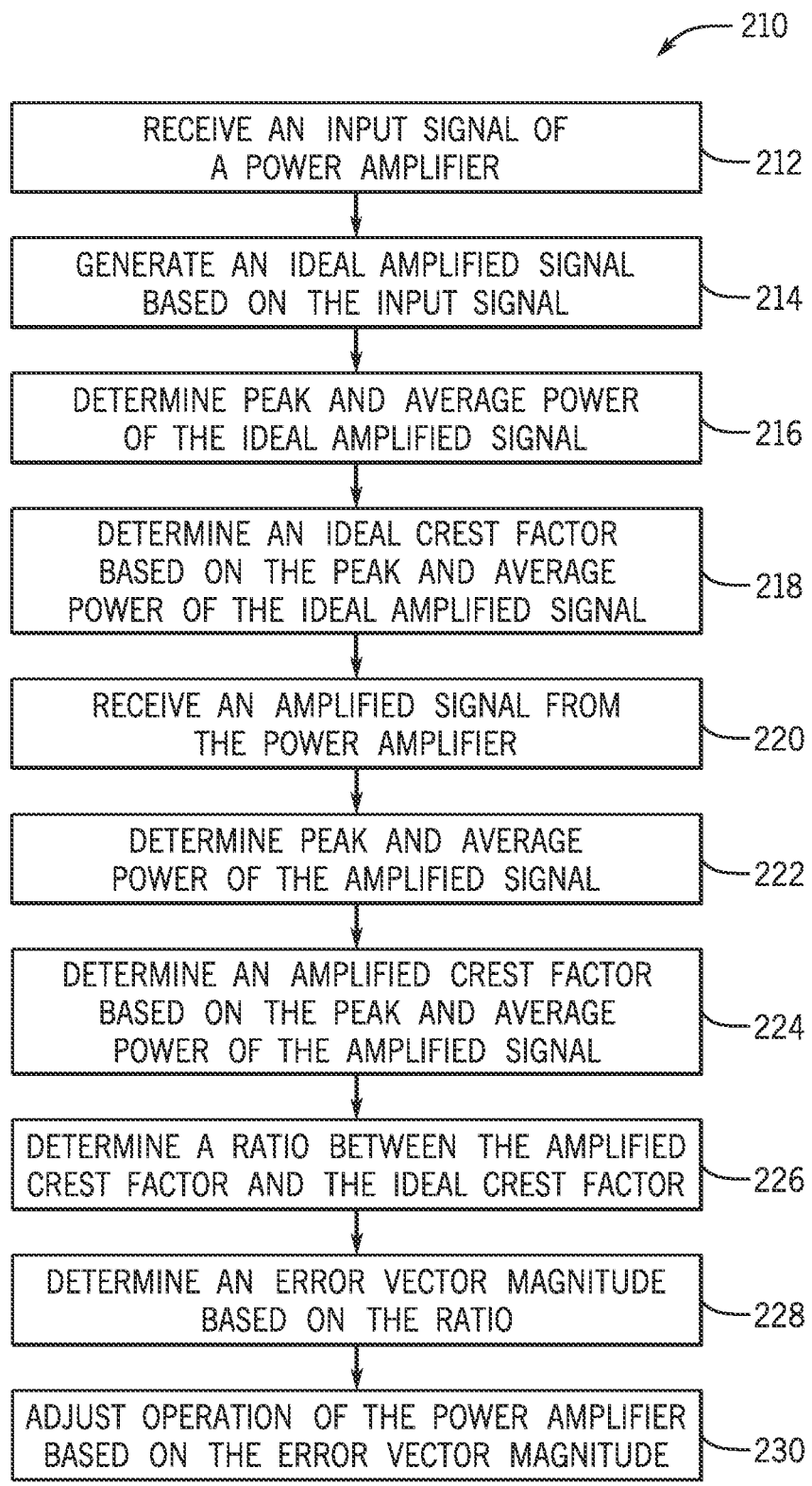
FIG. 13 is a flowchart of a method for efficiently transmitting a wireless signal at an increased transmission power with decreased interference to signals outside of a desired frequency channel, according to embodiments of the present disclosure.

As such, the power amplifier controller 96 may estimate or determine an error vector magnitude based on the measured or estimated crest factor and the amplified crest factor. FIG. 13 is a flowchart of a method 210 for efficiently transmitting a wireless signal at an increased transmission power with decreased interference to signals outside of a desired frequency channel, according to embodiments of the present disclosure. Any suitable device (e.g., a controller) that may control components of the electronic device 10, such as the processor 12, the power amplifier controller 96, may perform the method 210. In some embodiments, the method 210 may be implemented by executing instructions stored in a tangible, non-transitory, computer-readable medium, such as the memory 14 or storage 16, using the processor 12. For example, the method 210 may be performed at least in part by one or more software components, such as an operating system of the electronic device 10, one or more software applications of the electronic device 10, and the like. While the method 210 is described using steps in a specific sequence, it should be understood that the present disclosure contemplates that the described steps may be performed in different sequences than the sequence illustrated, and certain described steps may be skipped or not performed altogether.

In process block 212, the power amplifier controller 96 and/or the processor 12 may control the digital power meter 92 to receive an input signal of the power amplifier 66 (e.g., at the input 98 of the power amplifier 66). In process block 214, the power amplifier controller 96 and/or the processor 12 may control the digital power meter 92 to generate an estimated amplified signal based on the input signal. In particular, the vector CORDIC 162 may execute a vectoring algorithm to rotate one or more vectors of the input signal 160 to determine (e.g., estimate and/or simulate) an amplitude 164 of an ideally amplified (e.g., by the power amplifier 66) input signal or amplified without consideration of real-world factors, such as environmental factors (including temperature, humidity, and so on), process variation, manufacturing defects, channel frequency, beam-forming parameters, and so on). In process block 216, the power amplifier controller 96 and/or the processor 12 may receive or control the digital power meter 92 to determine a peak and average power of the estimated amplified signal. In particular, the wideband low-pass filter 166 may filter the amplitude 164 output by the vector CORDIC 162, and the max hold register 168 may determine the peak power 172 of the estimated amplified signal and the digital low-pass filter 170 may determine the average power 178 of the estimated amplified signal. In process block 218, the power amplifier controller 96 may then determine an estimated crest factor based on the peak power 172 and the average power 178 of the estimated amplified signal. The power amplifier controller 96 may determine the estimated crest factor by determining a ratio of the peak power 172 to the average power 178 of the estimated amplified signal.

In process block 220, the power amplifier controller 96 and/or the processor 12 may control the output power detector 94 to receive an amplified output signal 110 of the power amplifier 66 (e.g., at the output 102 of the power amplifier 66). In process block 222, the power amplifier controller 96 and/or the processor 12 may receive or control the output power detector 94 to determine a peak and average power of the amplified signal 110. In particular, the attenuator 112 may attenuate the amplified signal 110, and the wideband detector 116 may output an envelope 118 of the attenuated signal. The peak-hold detector 120 may determine the peak power 128 of the attenuated signal and the low-pass filter 122 may determine the average power 152 of the attenuated signal. In process block 224, the power amplifier controller 96 may then determine or receive an amplified crest factor based on the peak power 128 and the average power 152 of the amplified signal. The power amplifier controller 96 may determine the amplified crest factor by determining a ratio of the peak power 128 to the average power 152 of the estimated amplified signal.

In process block 226, the power amplifier controller 96 determines or receives a ratio (e.g., the crest factor compression) between the amplified crest factor and the estimated crest factor. In process block 228, the power amplifier controller 96 determines or receives an error vector magnitude based on the ratio, as the error vector magnitude correlates to the crest factor compression. In process block 230, the power amplifier controller 96 adjusts operation of the power amplifier 66 based on the error vector magnitude. For example, if the error vector magnitude is greater than a threshold value, then the power amplifier controller 96 may increase the amplification factor 80 of the power amplifier 66. For example, the power amplifier controller 96 may increase an input power of the input signal to the power amplifier 66, adjust bias voltages or currents of the power amplifier 66 to increase the amplification factor 80, and so on. In cases where the error vector magnitude is not greater than the threshold value, then the power amplifier controller 96 may maintain the amplification factor 80 of the power amplifier 66. The threshold value may include any error vector magnitude that indicates that there is sufficient headroom to increase the amplification factor 80 without entering the nonlinear region 84 of the power amplifier 66, such as 1% or greater, 4% or greater, 6% or greater, 8% or greater, 10% or greater, 12% or greater, and so on. In this manner, the method 210 may enable the power amplifier controller 96 to facilitate efficiently transmitting a wireless signal at an increased transmission power with decreased interference to signals outside of a desired frequency channel.

For the purposes of this disclosure, it should be understood that the prevention of the transmission signal to interfere with other signals outside of the desired frequency channel may refer to reduced or minimal interference by the transmission signal, such that the other signals may be received at respective receivers with sufficient signal power and quality to appropriately process the other signals (e.g., the received signal powers of the other signals are within a threshold of error compared to when the power backoff is applied, the received signal qualities of the other signals are within a threshold of error compared to when the power backoff is applied, data may be extracted from the other signals within a threshold of error, and so on).

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The invention claimed is:

1. A transmitter, comprising:
an amplifier;
a digital power meter coupled to an input of the amplifier;
an output power detector coupled to an output of the amplifier, the output power detector comprising an attenuator, a wideband detector coupled to the attenuator, and a peak-hold detector coupled in parallel with a low-pass filter to the wideband detector; and
control circuitry coupled to the digital power meter, the output power detector, and the amplifier.

2. The transmitter of claim 1, wherein the digital power meter is configured to determine an estimated crest factor based on an input signal received at the input of the amplifier.

3. The transmitter of claim 2, wherein the digital power meter is configured to determine the estimated crest factor by generating an estimated amplified signal and determine the estimated crest factor based on the estimated amplified signal.

4. The transmitter of claim 2, wherein the output power detector is configured to determine an amplified crest factor based on an output signal received at the output of the amplifier.

5. The transmitter of claim 4, wherein the control circuitry is configured to determine a ratio between the estimated crest factor and the amplified crest factor.

6. The transmitter of claim 5, wherein the control circuitry is configured to adjust an amplification factor provided by the amplifier based on the ratio between the estimated crest factor and the amplified crest factor.

7. The transmitter of claim 1, wherein the digital power meter is configured to execute a vectoring algorithm that rotates one or more vectors of an input signal received at the input of the amplifier and determine an amplitude.

8. The transmitter of claim 1, wherein the digital power meter comprises a first digital low pass filter coupled to a second digital low pass filter.

9. A method, comprising:
receiving, at processing circuitry of an electronic device, an estimated crest factor based on an input signal received at an amplifier of a transmitter of the electronic device;
receiving, at the processing circuitry, an amplified crest factor based on an output signal output by the amplifier;
determining, by the processing circuitry, a ratio between the estimated crest factor and the amplified crest factor; and
adjusting, by the processing circuitry, operation of the amplifier based on the ratio.

10. The method of claim 9, comprising generating, by the processing circuitry, an estimated amplified signal based on the input signal.

11. The method of claim 10, wherein generating, by the processing circuitry, the estimated amplified signal comprises executing, at the processing circuitry, a vectoring algorithm to rotate one or more vectors of the input signal to determine the estimated amplified signal.

12. The method of claim 10, comprising receiving, at the processing circuitry, a peak power and an average power of the estimated amplified signal, wherein receiving the estimated crest factor is based on the peak power and the average power of the estimated amplified signal.

13. The method of claim 9, comprising receiving, at the processing circuitry, a peak power and an average power of the output signal, wherein receiving the amplified crest factor is based on the peak power and the average power of the output signal.

14. The method of claim 9, comprising receiving, at the processing circuitry, an error vector magnitude based on the ratio between the estimated crest factor and the amplified crest factor, wherein adjusting the operation of the amplifier is based on the error vector magnitude.

15. An electronic device, comprising:
one or more antennas; and
a transmitter, comprising:
an amplifier configured to receive an input signal and amplify the input signal by an amplification factor to output an output signal;
a digital power meter configured to determine an estimated crest factor based on the input signal;
an output power detector configured to determine an amplified crest factor based on the output signal; and
control circuitry configured to adjust the amplification factor based on the estimated crest factor and the amplified crest factor.

16. The electronic device of claim 15, wherein the control circuitry is configured to determine a ratio between the estimated crest factor and the amplified crest factor.

17. The electronic device of claim 16, wherein the control circuitry is configured to adjust the amplification factor provided based on the ratio between the estimated crest factor and the amplified crest factor.

18. The electronic device of claim 16, wherein the control circuitry is configured to determine an error vector magnitude based on the ratio between the estimated crest factor and the amplified crest factor.

19. The electronic device of claim 18, wherein the control circuitry is configured to increase the amplification factor based on the error vector magnitude exceeding a threshold value.

20. The electronic device of claim 18, wherein the control circuitry is configured to maintain the amplification factor based on the error vector magnitude not exceeding a threshold value.

* * * * *